United States Patent [19]

Barkanic

[11] Patent Number: 5,275,692

[45] Date of Patent: Jan. 4, 1994

[54] METHOD FOR FABRICATING INTEGRATED CIRCUITS

[75] Inventor: John A. Barkanic, Schnecksville, Pa.

[73] Assignee: Keystone Applied Research, Schnecksville, Pa.

[21] Appl. No.: 902,221

[22] Filed: Jun. 22, 1992

[51] Int. Cl.$^5$ .................... H01L 21/00; H01L 21/02; B44C 1/22; C03C 15/00

[52] U.S. Cl. ................................ 156/643; 156/646; 437/225; 437/228

[58] Field of Search ............... 252/79.1; 156/643, 646; 437/225, 228

[56] References Cited

U.S. PATENT DOCUMENTS

| | | | |
|---|---|---|---|
| 3,969,487 | 7/1976 | Austin et al. | 423/472 |
| 3,975,501 | 8/1976 | Gordon et al. | 423/472 |
| 4,741,800 | 5/1988 | Yamazaki | 156/646 |

Primary Examiner—Brian E. Hearn
Assistant Examiner—B. Everhart
Attorney, Agent, or Firm—Salzman & Levy

[57] ABSTRACT

The present invention features new etchants to be utilized in the etching, depositing and growth processes for fabricating integrated circuits. The etchants contain a new family of compounds consisting of a single molecule. The molecule contains several halogen atoms, thus eliminating the need to add chlorine compounds in admixture with fluorine etchant materials. The new materials provide selectivity in the etching and deposition processes, as well as high product yield with high throughput. The etchants of this invention consist of a single amine molecule containing both fluorine and another halogen atom, consisting of chlorine or bromine, which are attached covalently to a nitrogen base atom. The basic formula for the molecule of this invention is given by:

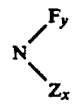

where:
Z = chlorine or bromine
y = 1 or 2;
x = 1 or 2; and
x + y = 3.

10 Claims, No Drawings

METHOD FOR FABRICATING INTEGRATED CIRCUITS

FIELD OF THE INVENTION

The present invention relates to an etchant for fabricating integrated circuits on microchips, and, more particularly, to etchants utilizing new, low-energy, halogen-containing compounds. The new etchants provide a unique, contamination-free etching environment. They derive their characteristics from a family of new compounds comprising an amine molecule which contains one nitrogen atom and both fluorine and another halogen atom, consisting of chlorine or bromine.

BACKGROUND OF THE INVENTION

The manufacture of microelectronic semiconductor devices has become increasingly miniaturized. This miniaturization has provided notable improvements in microchip performance, while reducing the cost of the fabricating materials. Such advantages in cost and performance, however, are not without drawbacks. The higher electronic component densities of these microchips has increased the difficulty of their fabrication. Manufacturing yields of high-density microchips tend to decrease proportionately with higher electronic component densities. Thus, there is a continuing need for new, high-yield processes for etching the microchip materials and/or depositing films on their surfaces. A major objective of every manufacturer is the continual improvement of the yields for the individual fabrication steps used to make the microchip.

It has recently been discovered that etchant admixtures containing molecular chlorine, $Cl_2$, can be used at great advantage in the fabrication process. The improvement in the etching reaction is believed to be partly due to the ability of the chlorine atoms to stabilize and regulate the aggressive etching characteristics of fluorine atoms.

When plasma-etching silicon, a fluorine-containing compound in admixture with chlorine gas has been found to provide good selectivity in accordance with the teachings in U.S. Pat. No. 4,310,380, issued to Flamm et al on Jan. 12, 1982. The admixture in the described process has been used successfully to control lateral undercutting.

Similarly, in U.S. Pat. No. 4,214,946, issued to Forget et al on Jul. 29, 1980, there are illustrated selective polysilicon etchant processes, utilizing a mixture of sulfur hexafluoride with chlorine, which is diluted with an inert gas. Sulfur hexafluoride admixed with chlorine provides an improvement over wet chemical etching, as well as plasma etching for sub-micron-sized lines having extremely close tolerances.

In U.S. Pat. No. 4,264,409, issued to Forget et al on Apr. 28, 1981, still another etchant comprising diluted chlorine and an inert gas admixture containing silicon tetrafluoride is described for the purpose of providing a highly selective etching process. Such a process is claimed to produce vertical sidewalls on the etched features, hence producing no mask undercuts. The process also eliminates the surface contamination associated with using the conventional etchants, carbon tetrafluoride or sulfur hexafluoride.

Chlorine admixtures have also been found to be advantageous in the deposition or growth of thin films. U.S. Pat. No. 4,746,549, entitled "Method for Forming Thin Film of Refractory Material", issued to Ito and Moriya on May 24, 1988, illustrates a method for selectively depositing a refractory metal, using a refractory metal halide admixed with hydrogen and chlorine. Further, U.S. Pat. No. T954,009, entitled "Method for Thermal Oxidation of Silicon with Added Chlorine", issued to Malin and Seybold on Jan. 4, 1977, demonstrates a film growth process which provides improved electrical properties for gate oxides used in field effect transistors.

Despite the improvements cited in the aforementioned patent processes, however, contamination and corrosion can easily be introduced with the addition of a chlorine gas admixture. Contamination and corrosion must be avoided, if high manufacturing yields are to be maintained. Hence, the chlorine is often diluted with inert gas to reduce the contaminating and corrosive effects. Unfortunately, the dilution of the chlorine also decreases, to some extent, its advantageous characteristics; therefore, a balancing of the chlorine gas and inert gas is usually necessary. This balancing act tends to produce unpredictable results, which often further limits the ability to provide high yields.

Another disadvantage of these chlorine admixtures is their introduction of complexities into the etching chemistries. The reaction complexities are primarily due to the increased number of reactants in the admixture necessary to practice the invention. This increase tends to add variability to the etching process; hence, there is often a decrease in process reproducibility, yield and throughput.

The present invention seeks to maintain the advantages provided by the chlorine admixtures, while eliminating or greatly reducing the aforementioned disadvantages.

The current invention comprises contamination-free selective etching and/or film deposition and growth, using new, low-energy, chlorine-containing etchants. The new etchant molecules have a distinct advantage over the prior art. Since reaction rates are good, heating of the electronic materials is minimized and device junction depths better controlled. Radiation damage to the electronic materials is also minimized, since the plasmas of the invention utilize a simplified, low-energy, interhalogen reaction. In addition, yields are maximized, since corrosion or contamination is eliminated or greatly reduced. Unlike their more energetic counterpart plasmas, the low energy of activation by which these molecules provide useful etching and/or film growth and deposition creates improvements in process throughput, as well as manufacturing yield.

The present invention utilizes a new family of etchants. The new etchant family features a single molecule containing a nitrogen atom and both fluorine and another halogen atom consisting of either chlorine or bromine. The size and constitutents of the etchant molecule provide for good reaction stoichiometry. On activation, the etchant molecule conveniently dissociates into only volatile species, without the formation of contaminant by-products.

The invention can be introduced during the formation of thin film structural layers of the chip, i.e., during deposition and growth processes. The invention can likewise be introduced after the formation of thin films of electronic material on the microchip surface, as when an apertured mask is used to selectively etch given areas of a thin film.

SUMMARY OF THE INVENTION

In accordance with the present invention, there are provided new etchants for etching and/or deposition and growth processes. The etchants selectively affect portions of a microchip's thin film of electronic material. The etchants feature a new family of compounds, each of which comprises a single molecule. The molecule can contain chlorine atom(s), thus eliminating the need to add chlorine in admixture with fluorine etchant materials. The new molecules provide selectivity in the build-up and/or etching processes, as well as high product yield and high throughput. The molecules of this invention comprise a gas containing, in formula, a small molecule containing one nitrogen atom bonded to both fluorine and another halogen atom consisting of either chlorine or bromine. The basic formula for the molecule of this invention is given by:

where:
Z=Halogen atom consisting of chlorine or bromine;
y=1 or 2;
x=1 or 2; and
x+y=3.

The molecules of this invention include, but are not limited to, $NCl_2F$ (dichlorofluoroamine), $NF_2Cl$ (difluorochloroamine) and mixtures thereof. The process utilizing this new family of compounds involves subjecting the microchip surface to the molecule and activating it by an electric field or other means of activation. The energy required for activation can be provided thermally or through optical radiation. The various activation techniques depend on the process used to modify the electronic materials on the microchip.

DESCRIPTION OF THE PREFERRED EMBODIMENT

Generally speaking, this invention pertains to an etchant for fabricating microchips. The etchant provides high yield and throughput without contamination. The processes contemplated by the invention use a new family of etchants which contain both fluorine and another halogen atom covalently bonded to a nitrogen atom.

The basic formula for the etchant of this invention is given by:

where:
Z=Halogen atom consisting of chlorine or bromine;
y=1 or 2;
x=1 or 2; and
x+y=3.

Typical etchants include $NCl_2F$ (dichlorofluoroamine), $NF_2Cl$ (difluorochloroamine) and derivatives thereof. The process utilizing this new family of compounds involves subjecting the microchip surface to the etchant and activating it by an electric field or other means of activation.

The following examples illustrate a few of the various processes in which the invention can be employed.

EXAMPLE 1

In an etching process of electronic material disposed on a microchip surface, a single crystal silicon wafer was patterned using a photosensitive polymer to provide apertured portions for etching. The wafer was placed directly on a powdered electrode in an aluminum vacuum chamber. The chamber was then evacuated. A mixture of 10% $NF_2Cl$ (difluorochloroamine) etchant gas in argon was introduced into the chamber, and the chamber was stabilized at a pressure of 0.10 torr. A total power of 150 watts was applied to the electrode to initiate the plasma. Etching of the apertured portions of the silicon was accomplished at rates ranging from 100 to 5000 angstroms per minute.

EXAMPLE 2

In a deposition process of electronic material on the surface of a microchip, a silicon wafer was placed in a quartz wafer boat. The wafer and boat were gradually loaded into a furnace. The temperature of the silicon wafer was brought to 500° C., while an argon carrier gas was used to purge the system. A mixture of reactive gases containing tungsten hexafluoride, hydrogen and difluorochloroamine was fed into the furnace. The pressure was regulated and maintained at 10 torr. Tungsten metal was deposited at rates ranging from 10 to 500 angstroms per minute. The deposition was accomplished on apertured or non-apertured surfaces.

EXAMPLE 3

In a process in which a thin film of electronic material was grown on the surface of a microchip, a silicon wafer was placed in a quartz wafer boat. The wafer and boat were gradually loaded into a furnace. The temperature of the furnace was maintained at 1,000° C. A gaseous mixture of dry oxygen and 0.10% difluorochloroamine was fed into the furnace at a pressure of 1 atmosphere, and the silicon surface of the wafer was allowed to oxidize, growing a silicon dioxide layer.

The above examples teach only a few methods by which the invention can be used to etch, deposit and grow electronic materials on a microchip surface. These examples are meant to be merely representative of the various, multiple ways in which the invention can be utilized. For example, in the etching process of EXAMPLE 1, a variety of electronic materials such as polysilicon, silicon dioxide, silicon nitride, tungsten, tungsten silicide, as well as compound semiconductor materials, such as gallium arsenide, gallium aluminum arsenide and indium phosphide, can be etched by the illustrated process. The low-energy etchants of the invention are generally characterized as having a mean activation and/or dissociation energy ranging from 0.04 to 3.00 electron-volts.

Using EXAMPLE 2, deposition of thin films can be achieved with a variety of materials, including silicon, silicon containing dielectrics, refractory metals and refractory metal silicides. Deposition using the described process can be performed by using temperatures ranging from 250 to 1,000° C. and pressures of 0.10 to 760 torr, depending on the materials and characteristics desired in the deposited film.

With EXAMPLE 3, thin films of electronic material can be grown using High Pressure Oxidation (HIPOX) or Rapid Thermal Oxidation (RTO) using radiant energy as the heat source.

The processes of this invention have a distinct advantage over the prior art, since heating of the electronic materials is minimized, and device junction depths can be better controlled. Radiation damage to the electronic materials is reduced or eliminated, since the invention requires a minimum of activation energy needed to form the species needed for etching. Further, contamination and corrosion are eliminated or greatly reduced, thereby maximizing manufacturing yields and product throughput.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described this invention, what is desired to be protected by Letters Patent is presented by the following appended claims.

What is claimed is:

1. A method of using a low-energy plasma used in the fabrication of microchips, comprising a gas having the general formula:

where:
Z = chlorine or bromine
y = 1 or 2;
x = 1 or 2; and
x + y = 3
said method comprising the steps of:

(a) forming a plasma of said gas; and
(b) using said plasma to etch a substrate of a microchip.

2. The method using the plasma of claim 1, wherein the gas is selected from a group of gases consisting of dichlorofluoroamine, difluorochloroamine and mixtures thereof.

3. The method using the plasma of claim 1, wherein said substrate comprises a silicon-containing substrate.

4. The method using the plasma of claim 3, wherein the silicon-containing substrate comprises materials to be etched that are selected from a group of materials consisting of silicon, silicon dioxide, silicon nitride, silicon oxynitride, tungsten, tungsten silicide and combinations thereof.

5. The method using the plasma of claim 1, further comprising a deposition process that deposits materials upon a silicon substrate.

6. The method using the plasma of claim 5, wherein the plasma is used in the deposition of materials selected from a group of materials consisting of silicon, silicon containing dielectrics, refractory metals, refractory metal silicides and combinations thereof.

7. The method using the plasma of claim 1, further comprising film growth process.

8. The method using the plasma of claim 7, wherein the film growth process comprises a HIPOX (high pressure oxidation) process.

9. The method using the plasma of claim 7, wherein the film growth process comprises an RTO (rapid thermal oxidation) process.

10. A method of utilizing a low-energy plasma used in the fabrication of microchips and containing a gas having a formula comprising a single amine molecule having fluorine and another halogen consisting of chlorine or bromine attached to a nitrogen base atom, comprising the steps of:

(a) forming a plasma of said gas; and
(b) using said plasma to etch a substrate of a microchip.

* * * * *